US008785305B2

(12) United States Patent
Ramdani

(10) Patent No.: US 8,785,305 B2
(45) Date of Patent: Jul. 22, 2014

(54) BACKSIDE STRESS COMPENSATION FOR GALLIUM NITRIDE OR OTHER NITRIDE-BASED SEMICONDUCTOR DEVICES

(75) Inventor: Jamal Ramdani, Scarborough, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 272 days.

(21) Appl. No.: 12/927,931

(22) Filed: Nov. 30, 2010

(65) Prior Publication Data

US 2011/0140118 A1    Jun. 16, 2011

Related U.S. Application Data

(60) Provisional application No. 61/284,069, filed on Dec. 11, 2009.

(51) Int. Cl.
*H01L 21/20* (2006.01)
*H01L 21/36* (2006.01)

(52) U.S. Cl.
USPC ............................................. 438/483; 257/66

(58) Field of Classification Search
USPC ................ 257/96, 200, 633, E33.034; 438/455–459
See application file for complete search history.

(56) References Cited

U.S. PATENT DOCUMENTS

| 5,837,378 | A | 11/1998 | Mathews et al. |
| 6,841,001 | B2 | 1/2005 | Saxler |
| 7,015,124 | B1 | 3/2006 | Fisher et al. |
| 7,198,671 | B2* | 4/2007 | Ueda .............................. 117/84 |
| 7,470,599 | B2* | 12/2008 | Nijhawan et al. ............. 438/457 |
| 7,976,630 | B2* | 7/2011 | Poblenz et al. ................ 117/86 |
| 2002/0037599 | A1* | 3/2002 | Ishida et al. ..................... 438/29 |
| 2002/0064359 | A1 | 5/2002 | Ouellet et al. |
| 2002/0167023 | A1* | 11/2002 | Chavarkar et al. ............. 257/194 |
| 2004/0124452 | A1 | 7/2004 | Wellhausen et al. |
| 2006/0006414 | A1* | 1/2006 | Germain et al. ............... 257/192 |
| 2006/0051938 | A1 | 3/2006 | Connell et al. |
| 2006/0191474 | A1* | 8/2006 | Chen et al. ..................... 117/104 |
| 2006/0197109 | A1* | 9/2006 | Saxler ............................ 257/201 |
| 2007/0278233 | A1* | 12/2007 | Albert .......................... 220/565 |

OTHER PUBLICATIONS

P.R. Hageman, et al., "Growth of GaN epilayers on Si(111) substrates using multiple buffer layers", Nat. Res. Soc. Symp. Proc., vol. 693, 2002 Materials Research Society, 6 pages.
Notiflcation of Transmittal of the International Search Report and the Written Opinion of the International Searchging Authority, or the Declaration dated Jul. 26, 2011 in connection with International Patent Application No. PCT/US2010/058293.

* cited by examiner

*Primary Examiner* — Phuc Dang
(74) *Attorney, Agent, or Firm* — Jacqueline J. Garner; Frederick J. Telecky, Jr.

(57) ABSTRACT

A method includes forming a stress compensation layer over a first side of a semiconductor substrate and forming a Group III-nitride layer over a second side of the substrate. Stress created on the substrate by the Group III-nitride layer is at least partially reduced by stress created on the substrate by the stress compensation layer. Forming the stress compensation layer could include forming a stress compensation layer from amorphous or microcrystalline material. Also, the method could include crystallizing the amorphous or microcrystalline material during subsequent formation of one or more layers over the second side of the substrate. Crystallizing the amorphous or microcrystalline material could occur during subsequent formation of the Group III-nitride layer and/or during an annealing process. The amorphous or microcrystalline material could create no or a smaller amount of stress on the substrate, and the crystallized material could create a larger amount of stress on the substrate.

20 Claims, 4 Drawing Sheets

BACKSIDE STRESS COMPENSATION FOR GALLIUM NITRIDE OR OTHER NITRIDE-BASED SEMICONDUCTOR DEVICES

CROSS-REFERENCE TO RELATED APPLICATION AND PRIORITY CLAIM

This application claims priority under 35 U.S.C. §119(e) to U.S. Provisional Patent Application No. 61/284,069 filed on Dec. 11, 2009, which is hereby incorporated by reference.

TECHNICAL FIELD

This disclosure relates generally to semiconductor devices. More specifically, this disclosure relates to backside stress compensation for gallium nitride or other nitride-based semiconductor devices.

BACKGROUND

Various Group III-V compounds are being investigated for use in high-power electronics applications. These compounds include "Group III-nitrides" such as gallium nitride (GaN) and aluminum gallium nitride (AlGaN). These compounds are often fabricated by epitaxial growth on substrates such as silicon, sapphire, and silicon carbide. The use of silicon substrates is often preferred due to its lower fabrication costs. Also, silicon substrates are suitable for monolithic integration with other silicon-based devices, such as CMOS and BiCMOS devices.

One problem is that epitaxial growth of Group III-nitrides on silicon <111> substrates often results in large lattice and thermal coefficient mismatches. Lattice mismatch can cause concave bending of the epitaxial layers and substrates, along with large threading dislocation density formations. When the thickness of an epitaxial layer exceeds a critical value, cracking and delimination can also occur. High thermal mismatch between the epitaxial layers and substrates can create tensile stress during cooling, which can cause additional cracking and delimination.

The cracking and delimination that occur can vary based on the diameter of a silicon substrate, a thickness of the silicon substrate, and a thickness of the epitaxial layer. For smaller-diameter silicon substrates (such as three-inch and four-inch diameter wafers), the maximum epitaxial layer thickness that can be achieved without cracks is often around 2.5 µm-3 µm. For larger-diameter silicon substrates (such as six-inch diameter wafers or larger), the maximum epitaxial layer thickness that can be achieved without cracks is typically 1 µm-2 µm for substrate thicknesses of about 650 µm-700 µm. Power devices with high breakdown voltages (such as more than 1,000V) often require epitaxial layer thicknesses in excess of 3 µm, which typically cannot be achieved with larger silicon substrates using current methods.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Figure 1:
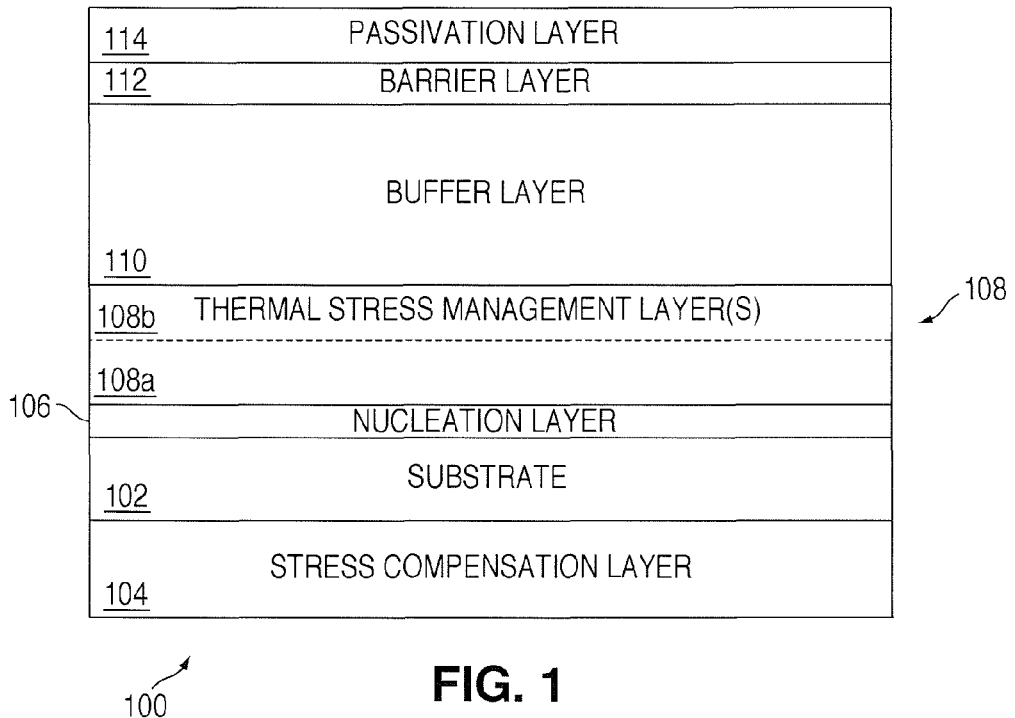
FIG. 1 illustrates an example semiconductor structure for Group III-nitride devices with backside stress compensation according to this disclosure.
Figure 2A:
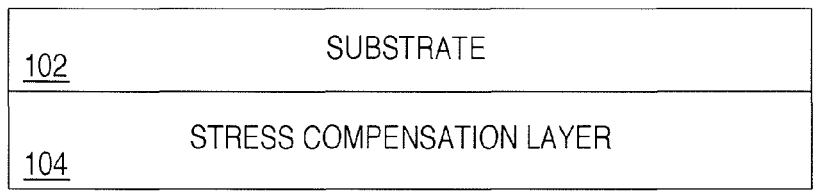
FIGS. 2A through 2G illustrate an example technique for forming a semiconductor structure having Group III-nitride devices with backside stress compensation according to this disclosure.
Figure 2B:
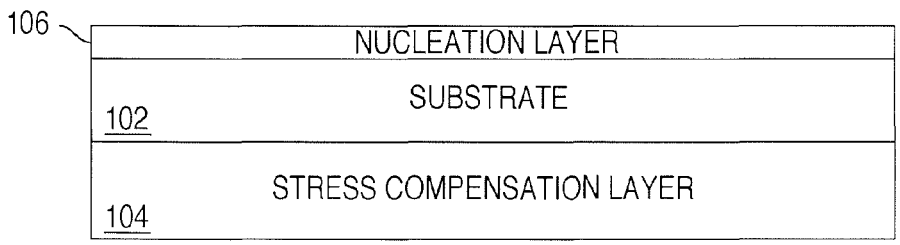
Figure 2C:
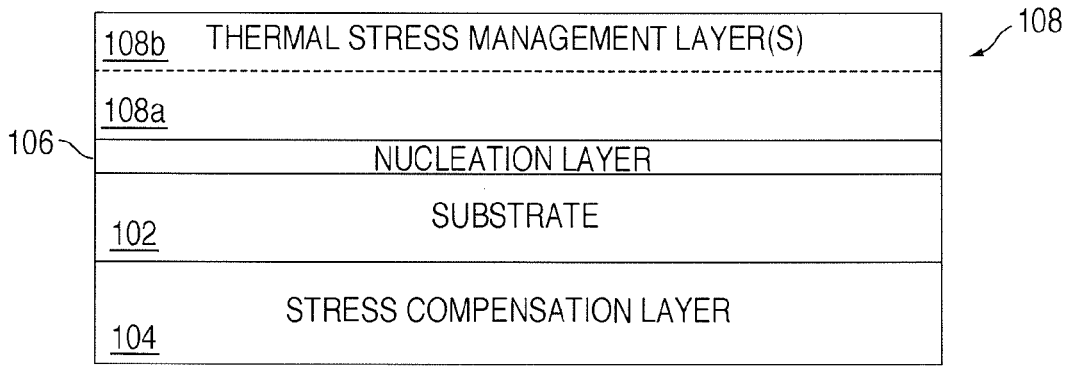
Figure 2D:
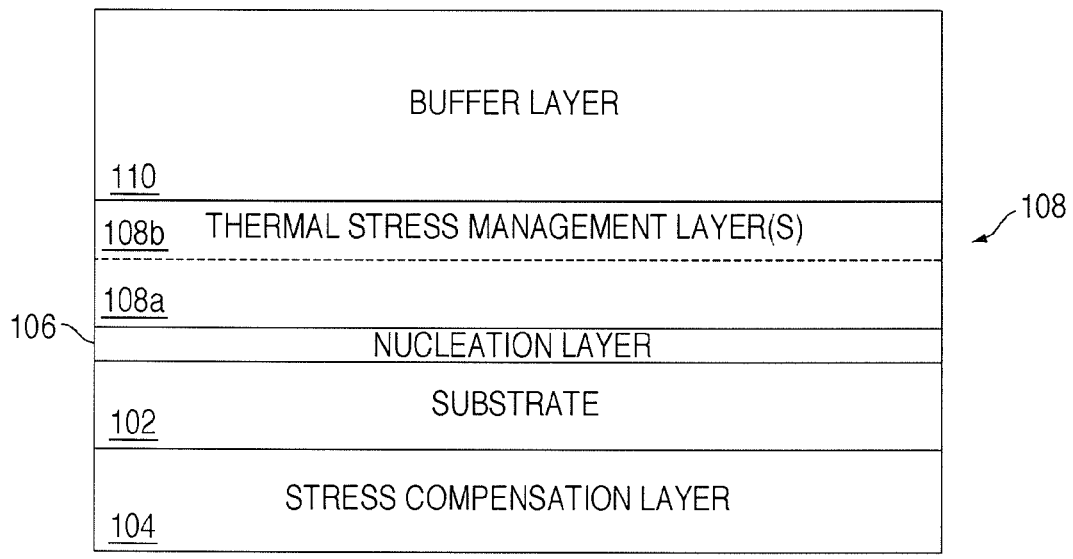
Figure 2E:
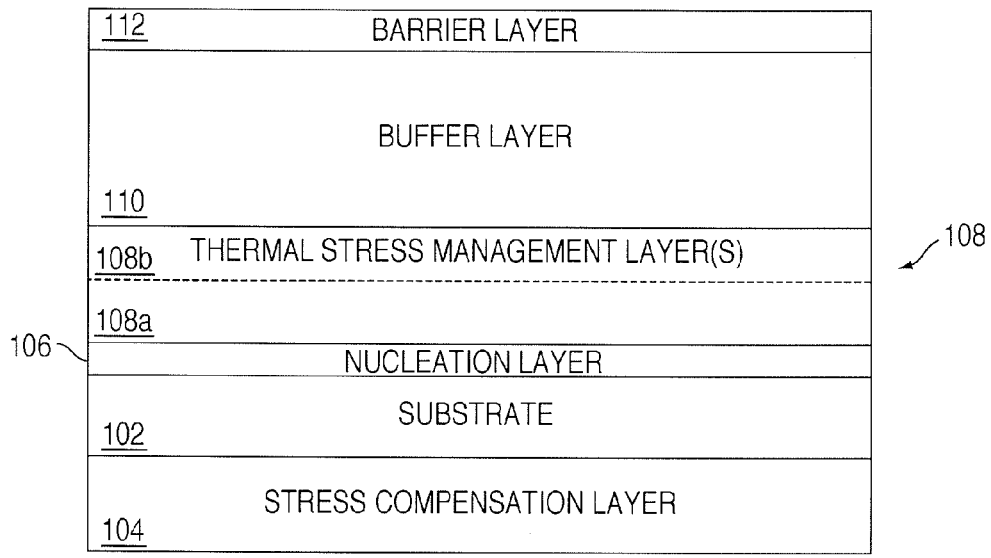
Figure 2F:
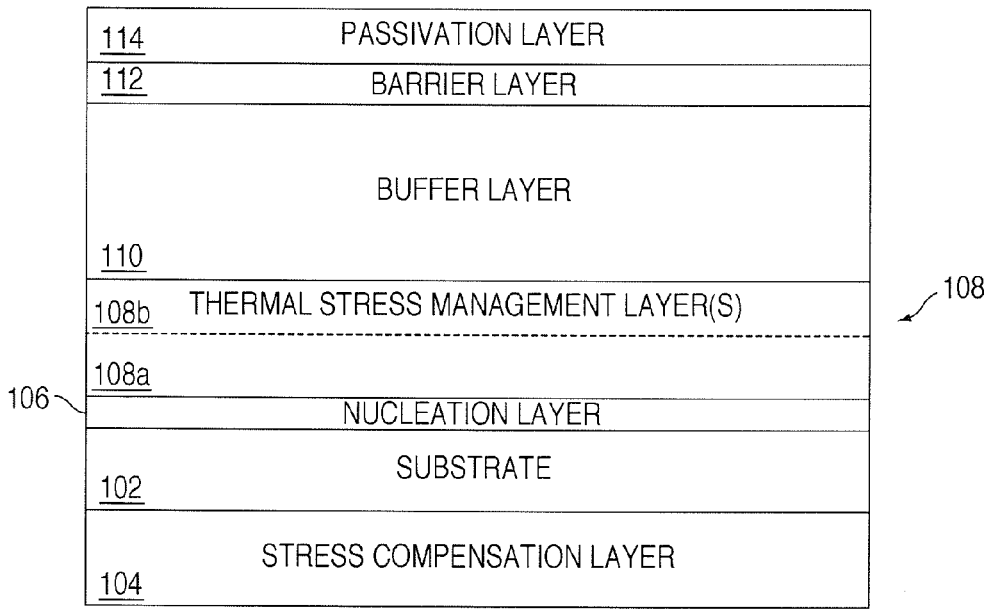
Figure 2G:
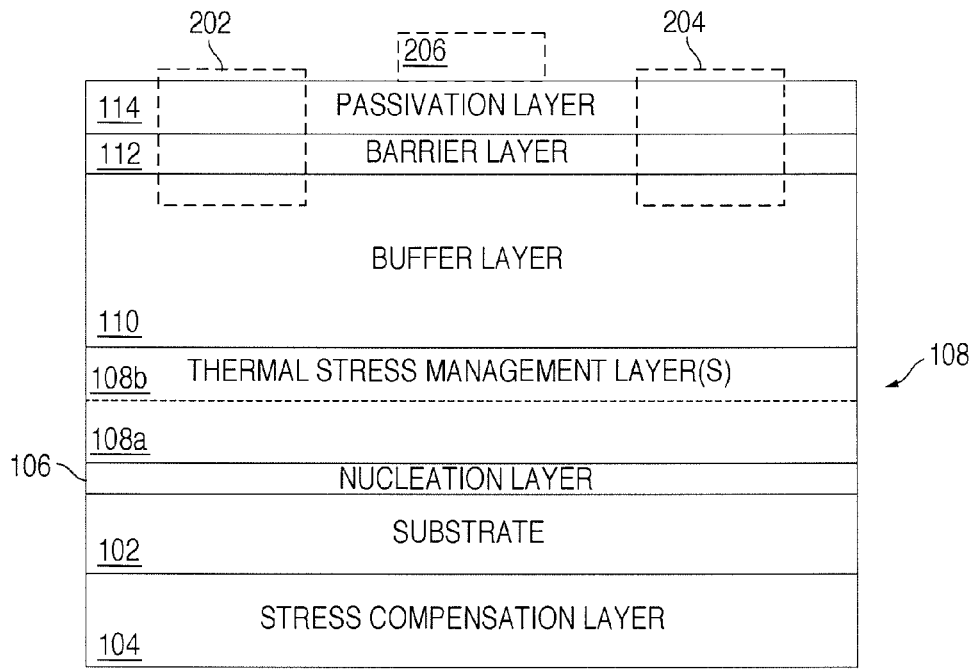
Figure 3:
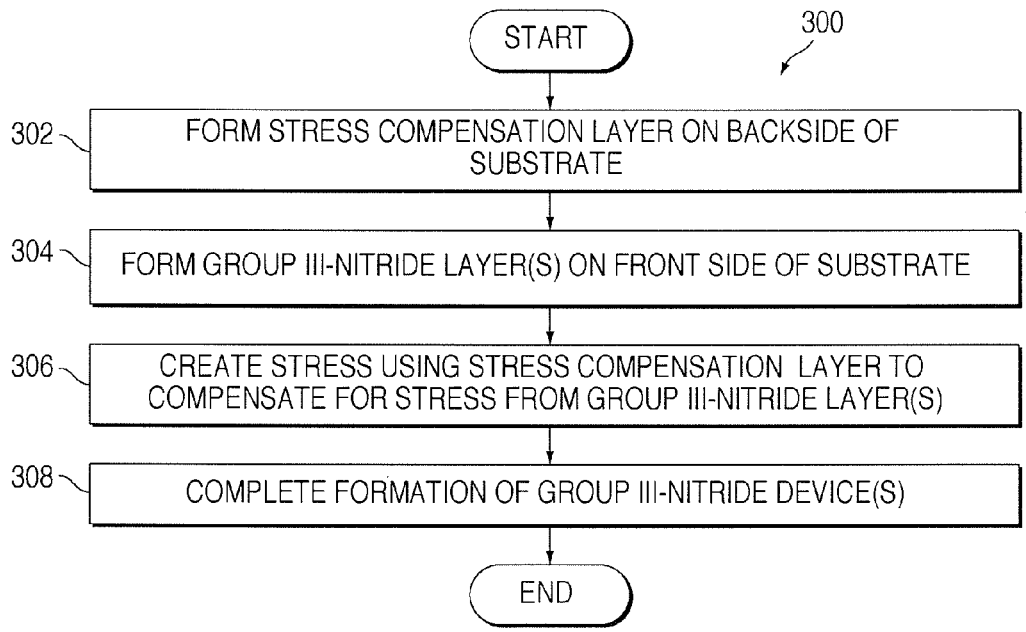
FIG. 3 illustrates an example method for forming a semiconductor structure having Group III-nitride devices with backside stress compensation according to this disclosure.

FIGS. 1 through 3, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

In general, this disclosure describes a technique for forming "Group III-nitride" devices on semiconductor substrates, such as silicon or silicon-on-insulator (SOI) substrates. A backside substrate stress compensation scheme is used to increase the thickness of one or more Group III-nitride epitaxial layers on a front side of a substrate. A "Group III-nitride" refers to a compound formed using nitrogen and at least one Group III element. Example Group III elements include indium, gallium, and aluminum. Example Group III-nitrides include gallium nitride (GaN), aluminum gallium nitride (AlGaN), indium aluminum nitride (InAlN), indium aluminum gallium nitride (InAlGaN), aluminum nitride (AlN), indium nitride (InN), and indium gallium nitride (InGaN). As particular examples, this technique could be used to form GaN, AlGaN, or other Group III-nitride epitaxial layers on silicon or SOI wafers.

FIG. 1 illustrates an example semiconductor structure 100 for Group III-nitride devices with backside stress compensation according to this disclosure. More specifically, FIG. 1 illustrates a cross-section of an example semiconductor structure 100 formed using at least one Group III-nitride compound. As shown in FIG. 1, the semiconductor structure 100 includes a semiconductor substrate 102, which represents any suitable substrate on which other layers or structures are formed. For example, the semiconductor substrate 102 could represent a silicon <111> substrate. The semiconductor substrate 102 could also represent a sapphire, silicon carbide, or other semiconductor substrate. The semiconductor substrate 102 could have any suitable size, such as a three-inch, four-inch, six-inch, eight-inch, twelve-inch, or other diameter.

A stress compensation layer 104 is formed over the backside of the semiconductor substrate 102. The stress compensation layer 104 helps to counteract stresses caused by materials deposited on the front side of the substrate 102. For example, the stress compensation layer 104 can be formed prior to formation of one or more Group III-nitride epitaxial layers over the front side of the substrate 102. The stress compensation layer 104 could be formed from any suitable material(s), such as an aluminum nitride or other Group III-nitride film. The stress compensation layer 104 could also be formed in any suitable manner, such as by using physical vapor deposition (PVD), chemical vapor deposition (CVD), or plasma-enhanced CVD (PECVD). During initial deposition, the stress compensation layer 104 may be stress-free or be slightly under tensile or compressive stress, such as between −250 MPa and +250 MPa.

A nucleation layer 106 is formed over the front side of the semiconductor substrate 102. The nucleation layer 106 could be formed from any suitable material(s) and in any suitable manner. For instance, the nucleation layer 106 can be formed by a low-temperature aluminum nitride layer, which could have a thickness of several nanometers up to 100 nm.

A thermal stress management layer 108, which often includes multiple layers such as layers 108a-108b, is formed over the nucleation layer 106. The thermal stress management layer 108 could be formed from any suitable material(s) and in any suitable manner. For example, the thermal stress management layer 108 could be formed using a combination of aluminum gallium nitride layers with different gallium concentrations to generate compressive stress. A low-temperature aluminum nitride layer can be inserted into the thermal stress management layer 108 since it is compressive. Other configurations of the thermal stress management layer 108 could also be used. For instance, the thermal stress management layer 108 could include super-lattice structures of aluminum nitride/aluminum gallium nitride (multiple thin layers each a few nanometers thick). The thermal stress management layer 108 could have a minimum of two layers, and those layers can be repeated two, three, or more times.

A buffer layer 110 is formed over the thermal stress management layer 108, and a barrier layer 112 is formed over the buffer layer 110. Each of the buffer and barrier layers 110-112 could be formed from any suitable material(s) and in any suitable manner. For example, both the buffer and barrier layers 110-112 can be formed from aluminum gallium nitride, and at least one of the layers 110-112 could represent an epitaxial layer. The aluminum concentration in the buffer layer 110 could be much less than the aluminum concentration in the barrier layer 112.

A passivation layer 114 is formed over the barrier layer 112. The passivation layer 114 could be formed from any suitable material(s) and in any suitable manner. For example, the passivation layer 114 could be formed from an oxide material.

The stress compensation layer 104 formed on the backside of the semiconductor substrate 102 can help to compensate for tensile stress caused by various ones of the layers 106-114 formed on the front side of the semiconductor substrate 102 during cooling. For example, after formation of the stress compensation layer 104 (such as an aluminum nitride film), the stress compensation layer 104 can undergo subsequent processing steps during which Group III-nitride power devices are formed over the front side of the substrate 102. The subsequent processing steps could include preparation of the substrate 102 for epitaxial growth, an annealing process, and formation of aluminum gallium nitride or other epitaxial layers needed for the power devices. During these or other steps, the stress compensation layer 104 can crystallize, and the grain growth can result in an increase in tensile stress on the backside of the substrate 102. This stress can compensate for the tensile stress that builds up on the substrate 102 from the epitaxial growth.

During a cool down process, the backside and front side tensile stresses compensate for each other, helping to keep the substrate 102 at an acceptable bow. This can help lead to the formation of crack-free epitaxial films with a total thickness of a power device active layer (such as layer 110) exceeding current limits, resulting in films with higher quality and higher device performances (higher breakdown voltages and drive currents). For six-inch or eight-inch silicon <111> substrates, this technique could be used to achieve thick (more than 3 µm) aluminum gallium nitride or other buffer layers 110 with no cracks. Also, the yield on wafer level preparation can be higher, leading to lower manufacturing costs. Further, aluminum nitride (with its high thermal conductivity) in the stress compensation layer 104 can provide additional heat spreading characteristics for high-temperature high-power operation and can also act as a backside seal protecting against contamination originating from the silicon substrate backside. In addition, the aluminum nitride layer can protect a metal organic chemical vapor deposition (MOCVD) substrate susceptor from silicon contamination, which can result in minimum susceptor and chamber conditioning needed for epitaxial growth reproducibility and wafer-to-wafer yields.

The semiconductor structure 100 could then be further processed to form various integrated circuit devices within or over the semiconductor structure 100. For example, power devices like gallium nitride-based field effect transistors (FET) or high electron mobility transistors (HEMT) could be formed using the semiconductor structure 100.

Although FIG. 1 illustrates one example of a semiconductor structure 100 for Group III-nitride devices with backside stress compensation, various changes may be made to FIG. 1. For example, while specific materials and manufacturing processes are described above, any other materials and manufacturing processes could be used to form various layers or other structures of the semiconductor structure 100. Also, while specific sizes or dimensions have been described, each layer of the semiconductor structure 100 could have any suitable size, shape, and dimensions.

FIGS. 2A through 2G illustrate an example technique for forming a semiconductor structure having Group III-nitride devices with backside stress compensation according to this disclosure. In FIG. 2A, the stress compensation layer 104 is formed on the backside of the substrate 102. In particular embodiments, the substrate 102 could represent a silicon <111> substrate (such as a wafer between four and twelve inches in diameter). The stress compensation layer 104 could represent an aluminum nitride layer that is coated on the substrate 102. This could be done using a PVD technique (such as radio frequency magnetron sputtering) or other suitable technique. The thickness of the aluminum nitride layer could range from 0.1 µm to 5 µm. The aluminum nitride can be sputtered at room temperature (RT) or heated up to a certain temperature (such as 400° C.). This can be done under specific conditions (such as a specific substrate bias, RF power, and $Ar/N_2$ partial pressure) that lead to the formation of amorphous and/or microcrystalline aluminum nitride with stress in the range of 0-250 MPa. Under these conditions, the substrate 102 may remain relatively flat with a minimum bow/warp as shown in FIG. 2A. Note that any other amorphous and/or microcrystalline material could be used in the stress compensation layer 104.

At this point, the substrate 102 with the stress compensation layer 104 may be transferred to an MOCVD or other system for growth of the structures used to form Group III-nitride based or other power devices. For example, as shown in FIGS. 2B through 2F, the nucleation layer 106, thermal stress management layer(s) 108, buffer layer 110, barrier layer 112, and passivation layer 114 are formed over the front side of the substrate 102. Upon heating in the MOCVD or other system and during the growth of at least some of the other layers 106-114, the amorphous or microcrystalline stress compensation layer 104 can crystallize and apply tensile stress on the backside of the substrate 102. The tensile stress from the front side and from the backside may substantially cancel each other, leading to reduced or minimum warp and formation of crack-free films with thicknesses exceeding required specifications (such as specifications for devices with breakdown voltages of more than 1,000V). This can be achieved even when larger-diameter substrates 102 are used.

As shown in FIG. 2G, integrated circuit elements 202-206 can be fabricated using the structure. The integrated circuit elements 202-206 could represent any suitable structures used to form one or more power devices. For instance, the elements 202-204 could represent a source and a drain of a Group III-nitride FET or HEMT, and the element 206 could represent a gate of the FET or HEMT. Note that any suitable number(s) and type(s) of Group III-nitride devices or other devices could be fabricated using the structure manufactured as shown in FIGS. 2A through 2F.

Although FIGS. 2A through 2G illustrate one example of a technique for forming a semiconductor structure having Group III-nitride devices with backside stress compensation, various changes may be made to FIGS. 2A through 2G. For example, while specific materials and processing techniques are described above, each layer or other component of the structure could be formed from any suitable material(s) and in any suitable manner.

FIG. 3 illustrates an example method 300 for forming a semiconductor structure having Group III-nitride devices with backside stress compensation according to this disclosure. As shown in FIG. 3, a stress compensation layer is formed on the backside of a semiconductor substrate at step 302. This could include, for example, forming an amorphous or microcrystalline layer of aluminum nitride or other Group III-nitride on the backside of the substrate 102 as the stress compensation layer 104. Note, however, that the stress compensation layer 104 could be formed from any other suitable material(s), and the stress compensation layer 104 need not be formed from a Group III-nitride.

One or more Group III-nitride layers are formed on the front side of the substrate at step 304. This could include, for example, forming a nucleation layer, thermal stress management layer(s), buffer layer, and barrier layer over the substrate 102. One or more of these layers could be omitted, however, depending on the implementation. At least one layer of Group III-nitride material can be formed in this step, such as one or more Group III-nitride epitaxial layers.

Stress is created using the stress compensation layer in order to compensate for stress from the one or more Group III-nitride layers at step 306. This could occur, for example, during the formation of the Group III-nitride layers or other structures over the front side of the substrate 102. For instance, if the stress compensation layer 104 is amorphous or microcrystalline when first formed, it could crystallize during later fabrication steps and create more stress in the substrate 102. As a particular example, the stress compensation layer 104 can create tensile stress on one side of the substrate 102 that counteracts tensile stress created on the other side of the substrate 102.

At this point, formation of one or more Group III-nitride devices could be completed at step 308. This could include, for example, forming sources, drains, and gates of one or more Group III-nitride FETs or HEMTs using the substrate structure.

Although FIG. 3 illustrates one example of a method for forming a semiconductor structure having Group III-nitride devices with backside stress compensation, various changes may be made to FIG. 3. For example, while shown as a series of steps, various steps in FIG. 3 could overlap, occur in parallel, or occur in a different order.

It may be advantageous to set forth definitions of certain words and phrases that have been used within this patent document. The terms "include" and "comprise," as well as derivatives thereof, mean inclusion without limitation. The term "or" is inclusive, meaning and/or.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method comprising:
   forming a stress compensation layer over a first side of a semiconductor substrate;
   forming a Group III-nitride layer over a second side of the semiconductor substrate; and
   forming a thermal stress management layer including an aluminum nitride layer and multiple aluminum gallium nitride layers with different gallium concentrations;
   wherein stress created on the semiconductor substrate by the Group III-nitride layer is at least partially reduced by stress created on the semiconductor substrate by the stress compensation layer.

2. The method of claim 1, wherein:
   forming the stress compensation layer comprises forming a stress compensation layer from amorphous or microcrystalline material; and
   the method further comprises crystallizing the amorphous or microcrystalline material during subsequent formation of one or more layers over the second side of the semiconductor substrate.

3. The method of claim 2, wherein crystallizing the amorphous or microcrystalline material comprises crystallizing the amorphous or microcrystalline material during subsequent formation of the Group III-nitride layer.

4. The method of claim 2, wherein crystallizing the amorphous or microcrystalline material comprises crystallizing the amorphous or microcrystalline material during an annealing process.

5. The method of claim 2, wherein:
   the amorphous or microcrystalline material creates no stress or a smaller amount of stress on the semiconductor substrate; and
   the crystallized material creates a larger amount of stress on the semiconductor substrate.

6. The method of claim 1, wherein forming the Group III-nitride layer comprises:
   forming a nucleation layer over the second side of the semiconductor substrate;
   forming the thermal stress management layer over the nucleation layer;
   forming an epitaxial buffer layer over the thermal stress management layer; and
   forming an epitaxial barrier layer over the buffer layer.

7. The method of claim 6, wherein:
   the nucleation layer comprises an aluminum nitride layer;
   the buffer and barrier layers comprise aluminum gallium nitride layers with different aluminum concentrations; and
   the stress compensation layer comprises an aluminum nitride layer.

8. The method of claim 6, wherein the epitaxial buffer layer has a thickness greater than 3 µm.

9. An apparatus comprising:
   a semiconductor substrate;
   a stress compensation layer over a first side of the semiconductor substrate;
   a Group III-nitride layer over a second side of the semiconductor substrate; and
   a thermal stress management layer comprising an aluminum nitride layer and multiple aluminum gallium nitride layers with different gallium concentrations;

wherein the apparatus is configured such that stress created on the semiconductor substrate by the Group III-nitride layer is at least partially reduced by stress created on the semiconductor substrate by the stress compensation layer.

10. The apparatus of claim 9, wherein:
the stress compensation layer comprises a crystallized form of an amorphous or microcrystalline material;
the amorphous or microcrystalline material creates no stress or a smaller amount of stress on the semiconductor substrate; and
the crystallized material creates a larger amount of stress on the semiconductor substrate.

11. The apparatus of claim 9, wherein the Group III-nitride layer comprises:
an epitaxial buffer layer over the thermal stress management layer and a nucleation layer; and
an epitaxial barrier layer over the buffer layer.

12. The apparatus of claim 11, wherein:
the nucleation layer comprises an aluminum nitride layer;
the epitaxial buffer and epitaxial barrier layers comprise aluminum gallium nitride layers with different aluminum concentrations; and
the stress compensation layer comprises an aluminum nitride layer.

13. The apparatus of claim 11, wherein the epitaxial buffer layer has a thickness greater than 3 μm.

14. The apparatus of claim 9, further comprising:
a passivation layer over the Group III-nitride layer.

15. A system comprising:
a semiconductor structure comprising:
a semiconductor substrate;
a stress compensation layer over a first side of the semiconductor substrate;
a Group III-nitride layer over a second side of the semiconductor substrate; and
a Group III-nitride integrated circuit device in or over the Group III-nitride layer; and
a thermal stress management layer comprising an aluminum nitride layer and multiple aluminum gallium nitride layers with different gallium concentrations;
wherein the semiconductor structure is configured such that stress created on the semiconductor substrate by the Group III-nitride layer is at least partially reduced by stress created on the semiconductor substrate by the stress compensation layer.

16. The system of claim 15, wherein:
the stress compensation layer comprises a crystallized form of an amorphous or microcrystalline material;
the amorphous or microcrystalline material creates no stress or a smaller amount of stress on the semiconductor substrate; and
the crystallized material creates a larger amount of stress on the semiconductor substrate.

17. The system of claim 15, wherein the Group III-nitride layer comprises:
an epitaxial buffer layer over the thermal stress management layer and a nucleation layer; and
an epitaxial barrier layer over the buffer layer.

18. The system of claim 17, wherein:
the nucleation layer comprises an aluminum nitride layer;
the buffer and barrier layers comprise aluminum gallium nitride layers with different aluminum concentrations; and
the stress compensation layer comprises an aluminum nitride layer.

19. The system of claim 17, wherein the epitaxial buffer layer has a thickness greater than 3 μm.

20. The system of claim 15, wherein the Group III-nitride integrated circuit device comprises at least one of: a Group III-nitride field effect transistor (FET) and a Group III-nitride high electron mobility transistor (HEMT).

* * * * *